United States Patent [19]

Nishi

[11] Patent Number: 5,760,454
[45] Date of Patent: Jun. 2, 1998

[54] PATTERN FORM OF AN ACTIVE REGION OF A MOS TYPE SEMICONDUCTOR DEVICE

[75] Inventor: Kenji Nishi, Tokyo, Japan

[73] Assignee: Oki Electric Industry Co., Ltd., Tokyo, Japan

[21] Appl. No.: 619,013

[22] Filed: Mar. 20, 1996

[30] Foreign Application Priority Data

Apr. 11, 1995 [JP] Japan ................................. 7-085411

[51] Int. Cl.⁶ .......................... H01L 29/76; H01L 27/10
[52] U.S. Cl. ...................... 257/401; 257/202; 257/204; 257/390
[58] Field of Search ........................... 257/401, 202, 257/204, 390

[56] References Cited

U.S. PATENT DOCUMENTS 5,444,275 8/1995 Kugishima et al. ..................... 257/401
5,468,982 11/1995 Hshieh et al. ........................... 257/401
5,539,246 7/1996 Kapoor ..................................... 257/401

FOREIGN PATENT DOCUMENTS 56-69865 6/1981 Japan ...................................... 257/401
2-56971 2/1990 Japan.

*Primary Examiner*—Ngân V. Ngô

[57] ABSTRACT

An object of the present invention is to micronize (i.e., reduce the size of) a MOS semiconductor device without reducing the operating speed of the device. An active region for the formation of a transistor has edges defined as the boundaries between the active region and a device separation region. The distance from one edge of the active region, which extends in the direction parallel to a gate width of the transistor, to the other edge decreases as the distance from a gate electrode along the direction of a gate length, which intersects the direction of the gate width increases. Thus, the size of the MOS semiconductor device can be decreased without impairing its speedup.

18 Claims, 8 Drawing Sheets

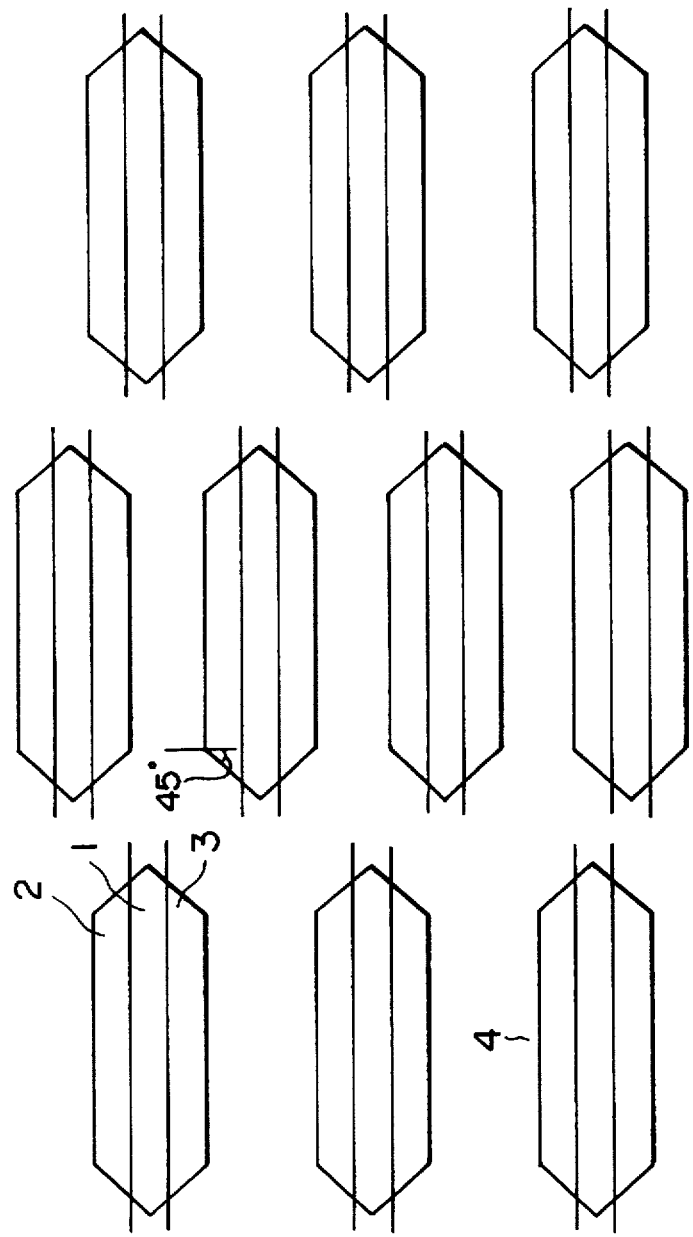

PATTERN FORM OF AN ACTIVE REGION OF A MOS TYPE SEMICONDUCTOR DEVICE

BACKGROUND OF THE INVENTION

1. Field of the Invention

This invention relates to a MOS (Metal-Oxide Semiconductor) device, and particularly to a pattern form of an active region in which a MOS transistor is formed and a pattern arrangement.

2. Description of the Related Art

The performance of a MOS transistor, which is typified by its operating speed or the like, is principally determined according to the width and length of a gate of the transistor. When two MOS transistors identical in gate length are compared with each other, the transistor whose gate width is basically greater than that of the other can permit a greater current flow. Thus, the MOS transistor having the greater gate width can be operated at a higher speed.

A pattern of an active region for forming a conventional MOS transistor takes the form shown in FIG. 1. In FIG. 1, symbols, W, Lg and L indicate the width of a gate of the MOS transistor, the length of the gate thereof and the length of the active region for the formation of the MOS transistor, respectively. In a SOG (Sea Of Gate) structure employed in a gate array or the like, for example, a distance d between adjacent transistors is determined in accordance with a design rule (see FIG. 2). Thus, an area S1 per transistor is given by the following expression:

$$S1 = (W+d)*(L+d)$$

It can be understood from the above expression that if the gate width increases to operate the MOS transistor at a higher speed, then the transistor area S1 is also increased. Namely, there is a cross relationship that carrying the micronization (i.e., reducing the size) of the MOS transistor leads to a hard-to-speed up state, whereas carrying its speedup makes it unable to micronize the MOS transistor.

It has therefore been desired to carry the micronization of the MOS transistor without reducing the operating speed of the device.

SUMMARY OF THE INVENTION

With the foregoing in mind, it is therefore an object of the present invention to provide a MOS device wherein size reduction and increase in operating speed can be achieved simultaneously.

According to one aspect of the present invention, for achieving the above object, there is provided a MOS semiconductor device as a typical example, which comprises:

a semiconductor substrate having a main surface;

an active region formed on the main surface of the semiconductor substrate;

a device separation region for surrounding the active region; and a gate electrode formed so as to cross the active region and extend in a first direction;

the active region having edges defined as the boundaries between the active region and the device separation region, the distance from one edge extending in the first direction to the other edge becoming short with distance from the gate electrode along a second direction intersecting the first direction.

BRIEF DESCRIPTION OF THE DRAWINGS

While the specification concludes with claims particularly pointing out and distinctly claiming the subject matter which is regarded as the invention, it is believed that the invention, the objects, features and advantages thereof will be better understood from the following description taken in connection with the accompanying drawings in which:

FIG. 12 is a plan view of array patterns of MOS transistors each showing an eighth embodiment of the present invention.

DETAILED DESCRIPTION OF THE PREFERRED EMBODIMENTS

Figure 1:
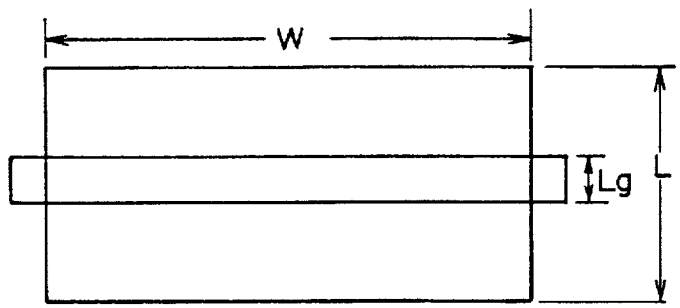
FIG. 1 is a plan view showing the shape of a conventional active region.
Figure 2:
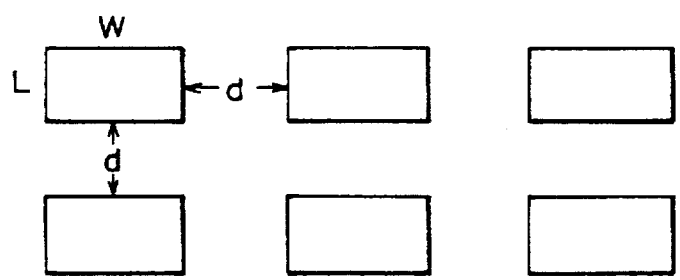
FIG. 2 is a plan view illustrating array patterns of conventional MOS transistors.
Figure 3:
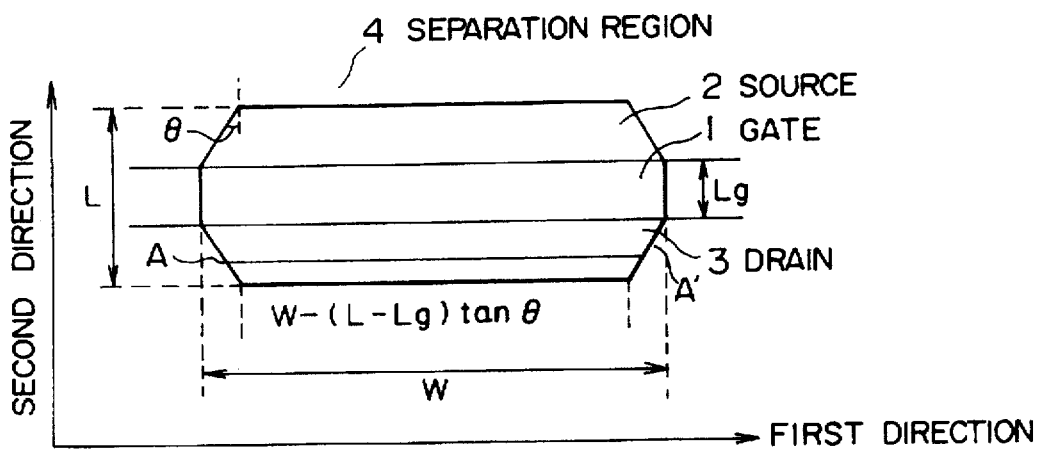
FIG. 3 is a plan view depicting the shape of an active region employed in a first embodiment of the present invention.

FIG. 3 is a plan view of an active region for forming a MOS transistor showing a first embodiment of the present invention.

In the same drawing, the active region for the MOS transistor is shaped in the form of an octagon. A rectangular gate 1 is formed in the center of the active region. The term "gate" as used herein shows a portion located on a region in which a channel is formed within the active region. A trapezoidal source 2 and a trapezoidal drain 3 are formed on both sides of the gate 1. A device separation region 4 is formed around the active region.

An area S2 of the MOS transistor according to the present embodiment is given by the following expression:

$$S2 = L_g W + \{2W - (L - L_g) \cdot \tan\theta\} \cdot (L - L_g)/2$$
$$= LW - (L - L_g)^2 \tan\theta/2$$

In the above expression, symbol W indicates the width (extending in a first direction as seen in the drawing) of the gate of the transistor, symbol L indicates the length (corresponding to the longest portion extending in a second direction as seen in the drawing) of the active region, symbol Lg indicates the length of the gate thereof, and symbol θ indicates a tapered or cone angle of each of the source 2 and the drain 3.

An area S1 of a conventional transistor in which Lg=0.5 μm, W=10 μm and L=3 μm as a typical example is compared with the area S2. In this case, the area S1 is calculated with d as equal to 0 (d=0) in the expression of S1 to obtain S1=30 μm². The area S2 becomes a function varied according to the cone angle θ. A change in S2/S1 corresponding to the result of comparison is indicated by the solid line in FIG. 4.

Figure 4:
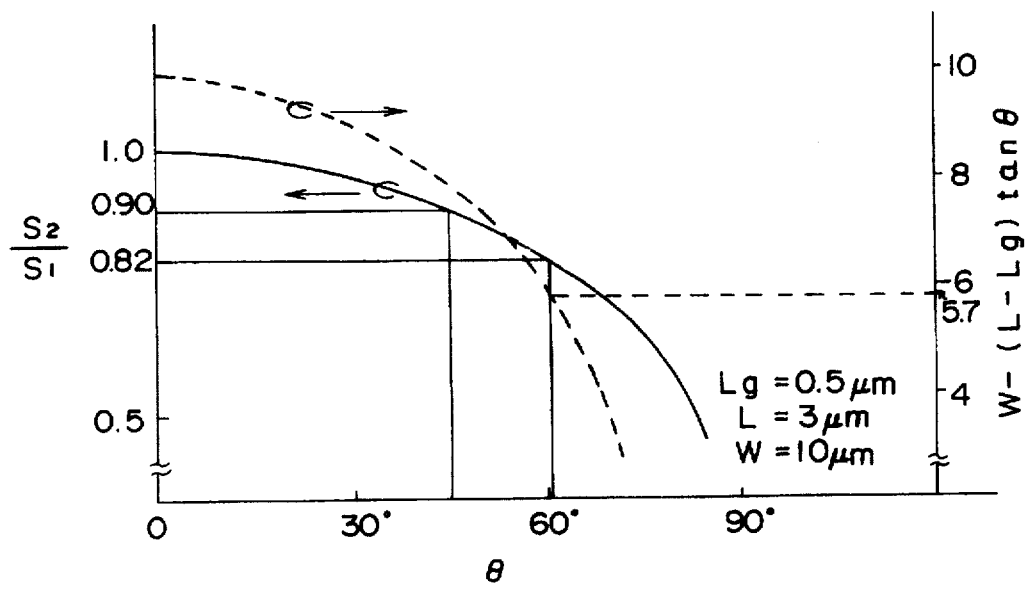
FIG. 4 is a view for describing the ratio of the area of the shape of the conventional active region to that of the shape of the active region shown in FIG. 3.

In FIG. 4 as well, a change in {W−(L−Lg)·tanθ} indicative of the minimum dimension, which extends in the direction (first direction) parallel to the gate width in the active region of the transistor, is also indicated by the dotted line.

Since the {W−(L−Lg)·tanθ} becomes small as the cone angle θ excessively increases, the resistance between a portion where the source and drain make contact with each other and the channel increases. However, if the cone angle θ is of 60 degrees or so, then the {W−(L−Lg)·tanθ} becomes a sufficiently large value of 5.7 μm. Even in this case, a large advantageous effect can be brought about that an area reduction ratio is about 20%. Namely, when a pattern corresponding to the active region for the conventional transistor is compared with that corresponding to the active region employed in the present embodiment, the area of the active region for the transistor can be reduced by 20% to obtain the same performance under the same design rule.

In the present embodiment, the area of the active region is calculated in the form of the octagon for the sake of clarity. This effect is however produced if the dimensions of the active area of a portion parallel to the gate width, i.e., the length of a portion taken along line A—A' in FIG. 3 becomes short with distance from the gate. Namely, an area reduction effect presents no problem even in the case of an ellipse.

Figure 5:
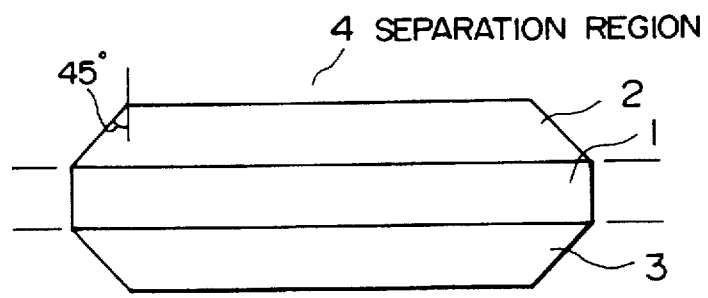
FIG. 5 is a plan view showing the shape of an active region employed in a second embodiment of the present invention.

FIG. 5 is a plan view of an active region for a MOS transistor showing a second embodiment of the present invention.

In the second embodiment as shown in the same drawing, the cone angle θ employed in the first embodiment is restricted to 45 degrees.

It is understood from FIG. 4 in this case that the area of the active region for the transistor can be reduced by 10% or so as compared with the conventional pattern.

On the other hand, when a mask is created, an electron beam drawing device is used. In the present electron beam drawing device, an image can be drawn at high speed at multiple angles such as 90 degrees and 45 degrees from the viewpoint of its system. Thus, if the tapered angle is set to 45 degrees as in the present embodiment, electron beam drawing for creating the mask can be sped up.

Figure 6:
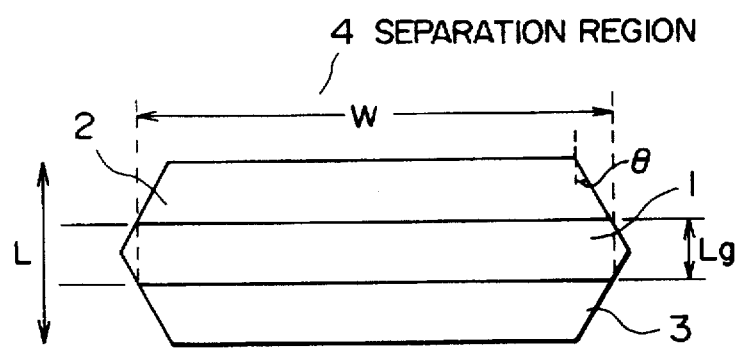
FIG. 6 is a plan view illustrating the shape of an active region employed in a third embodiment of the present invention.

FIG. 6 is a plan view of an active region for a MOS transistor showing a third embodiment of the present invention.

As shown in FIG. 6, the active region used for the MOS transistor is represented in the form of a hexagon. A hexagonal gate 1 is formed in the center of the active region. A trapezoidal source 2 and a trapezoidal drain 3 are formed on both sides of the gate 1. Further, a device separation region 4 is formed around the active region. In the same drawing, symbols W, L, Lg and θ respectively indicate the width the gate of the transistor, the length of the active region, the length of the gate thereof, and a tapered or cone angle of each of the source 2 and the drain 3. The second embodiment is different from the first embodiment in that the active region for the MOS transistor is shaped in the form of the hexagon.

If the area of the active region employed in the present embodiment is defined as S3, then the area S3 is given by the following expression:

$$S3=LW-(L-Lg)^2 \cdot \tan\theta/2 + Lg^2 \cdot \tan\theta/2$$

$$=LW-(L^2-2LgL) \cdot \tan\theta$$

Since L>Lg, the area S3 is reduced as compared with that of the conventional active region. When the cone angle θ is set equal to 60 degrees, for example, the area can be reduced by 30% or more if the same values as those employed in the typical example shown in the first embodiment are used.

There may often be cases where graphics are processed by a combination of a triangle and a quadrangle upon layout data processing by a normal computer. In the present embodiment, the graphics can be divided into two triangles and a single quadrangle. For example, at least two triangles are still necessary in the first embodiment. Thus, layout data processing speed can be rendered fast by shaping the active region in the form of the hexagon.

Figure 7:
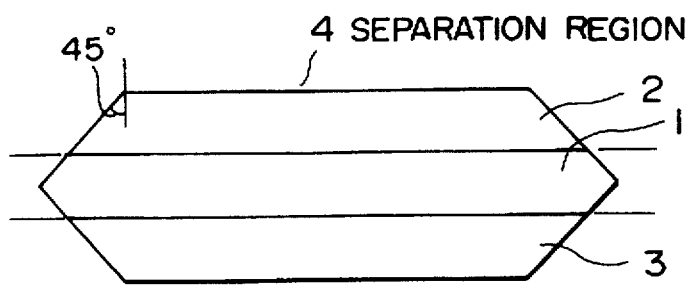
FIG. 7 is a plan view depicting the shape of an active region employed in a fourth embodiment of the present invention.

FIG. 7 is a plan view of an active region for a MOS transistor showing a fourth embodiment of the present invention.

In the fourth embodiment as shown in the drawing, the tapered or cone angle θ employed in the third embodiment is limited to 45 degrees.

In the present embodiment, the area can be reduced by 20% as compared with the conventional active area. Further, the sped of electron beam drawing for creating a mask and layout data processing can be increased in a manner similar to the second embodiment.

Figure 8:
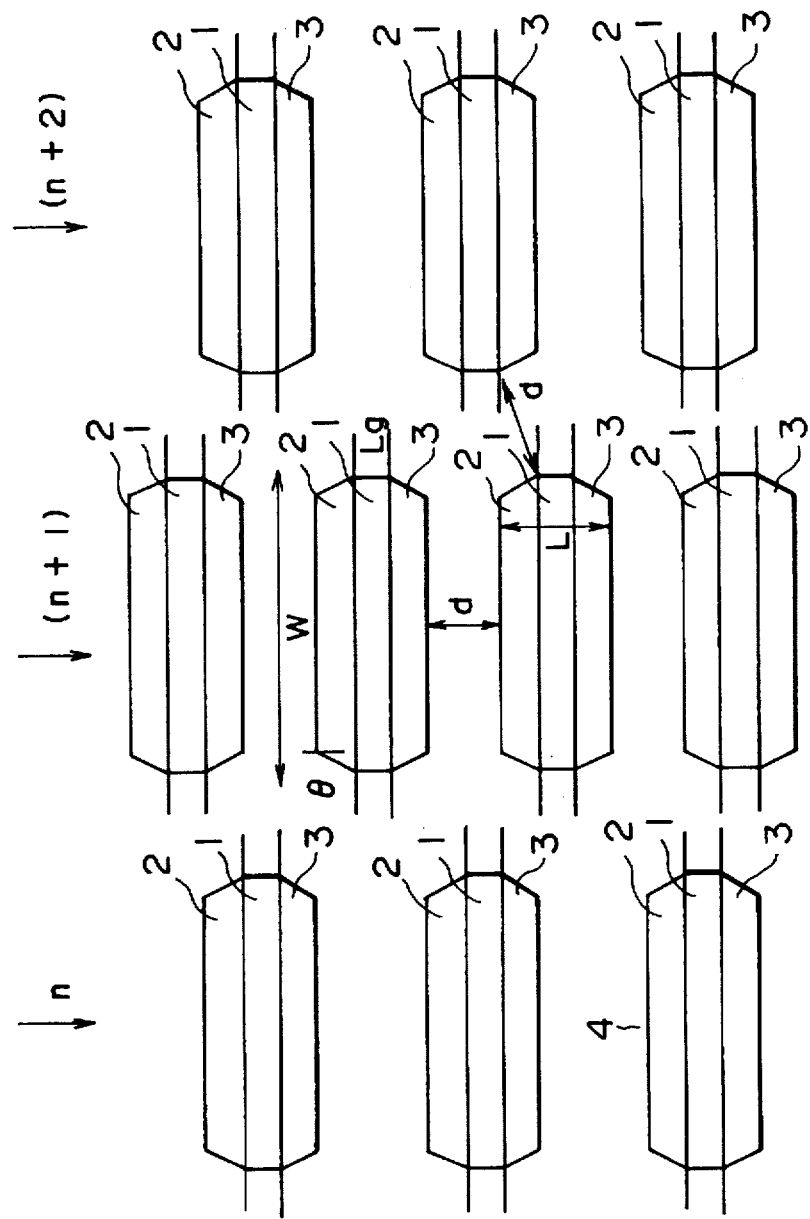
FIG. 8 is a plan view of array patterns of MOS transistors each illustrating a fifth embodiment of the present invention.

FIG. 8 is a plan view of array patterns of active regions for MOS transistors each showing a fifth embodiment of the present invention. Each active region is surrounded by a device separation region 4.

As is understood from the drawing, the present embodiment describes the case where the pattern of the active region for the transistor according to the first embodiment is provided in plural form as in the case of the Sea Of Gate Structure. The distance between the active regions for the adjacent transistors is defined as d determined based on a design rule. Displacements of the active regions are caused between an n column and an n+1 column and the active regions are configured so as to be aligned parallel to each other between the n column and an n+2 column.

In the present embodiment, an area S4 occupied by a single transistor region is given by the following expression:

$$S4=(L+d)[W+d\{1/\cos\theta-\tan\theta\}+(Lg-L)\tan\theta]$$

Figure 9:
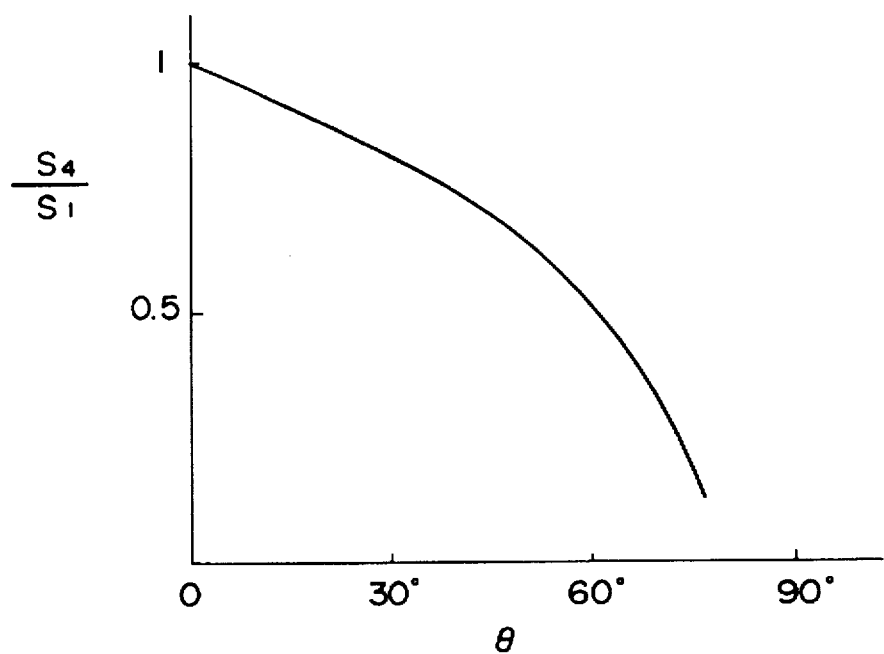
FIG. 9 is a view for describing the ratio of the area of each of the array patterns of the conventional MOS transistors to that of each of the array patterns of the MOS transistors according to the fifth embodiment of the present invention.

Assuming that Lg=0.5 μm, W=10 μm, L=3 μm and d=3 μm as a typical example, the conventional area S1=(W+d)*(L+d) is compared with the area S4. The result of comparison S4/S1 is shown in FIG. 9. When θ=60 degrees, for example, an area reduction ratio becomes an extreme large value of 50%. Namely, when the comparison between the conventional transistor pattern and each of the patterns employed in the present embodiment is made, the area can be reduced by 50% to obtain the same performance under the same design rule.

Figure 10:
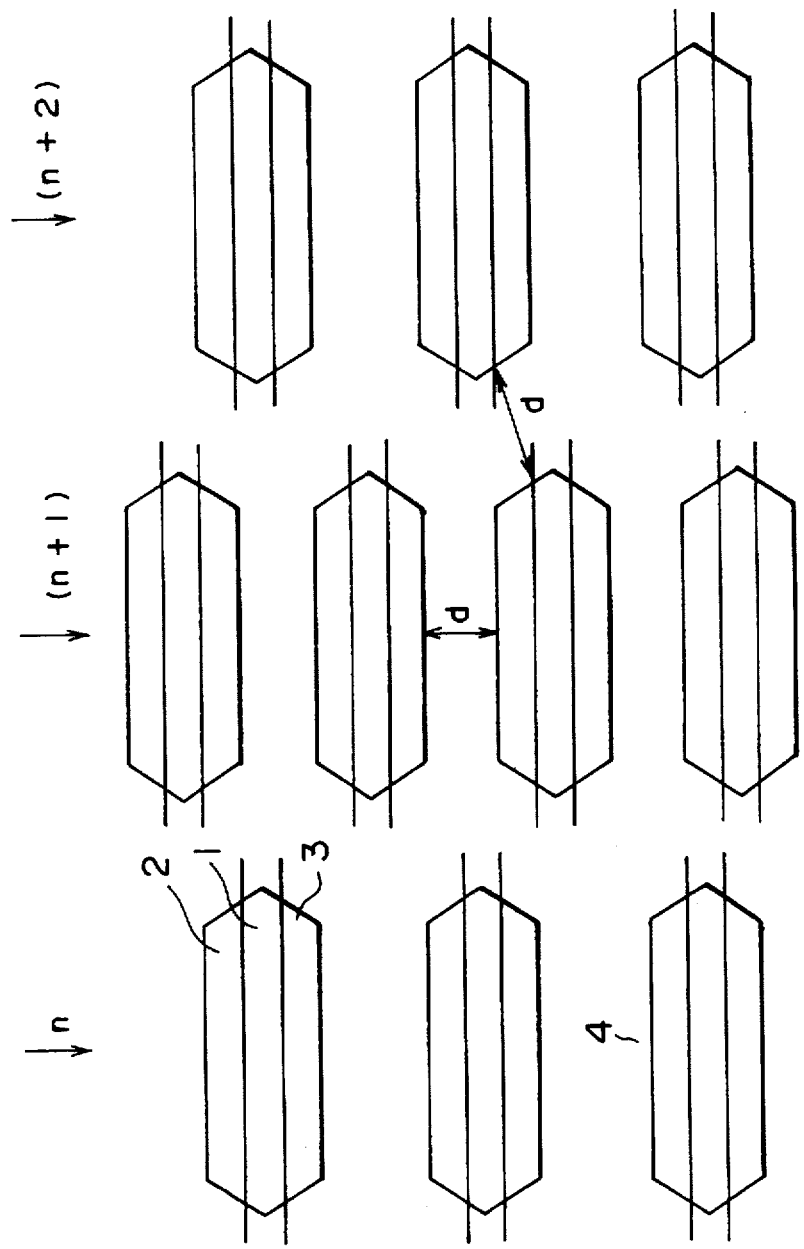
FIG. 10 is a plan view of array patterns of MOS transistors each showing a sixth embodiment of the present invention.

FIG. 10 is a plan view of array patterns of active regions for MOS transistors each showing a sixth embodiment of the present invention.

The present embodiment describes the case where the pattern of the active region for the transistor showing the third embodiment is arranged in plural form as in the case of the Sea Of Gate structure. In the present embodiment, the distance between the active regions for the adjacent transistors is defined as d determined in accordance with the design rule. An area occupied by a single transistor region in the present embodiment is identical to that employed in the third embodiment.

Since each pattern is simplified in the present embodiment, the number of data can be reduced when layout data are processed by a computer.

Figure 11:
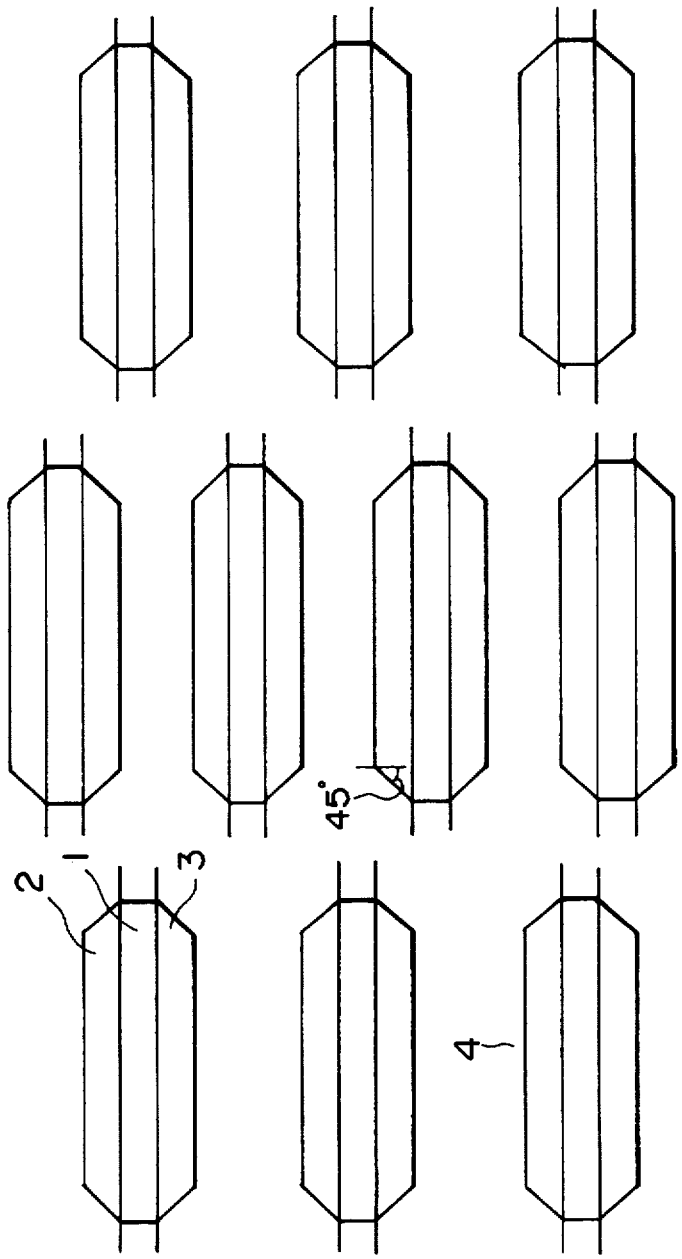
FIG. 11 is a plan view of array patterns of MOS transistors each illustrating a seventh embodiment of the present invention.

FIG. 11 is a plan view of array patterns of active regions for MOS transistors each showing a seventh embodiment of the present invention.

The present embodiment shows the case where the pattern in which the cone angle θ of the active region for the transistor showing the second embodiment is restricted to 45 degrees, is disposed in plural form as illustrated by the fifth embodiment. Even in the case of the present embodiment, the area can be reduced as compared with the area of the conventional active region. Further, the speed of electron beam drawing for creating a mask can be increase in a manner similar to the second embodiment.

FIG. 12 is a plan view of array patterns of active regions for MOS transistors each showing an eighth embodiment of the present invention.

The present embodiment describes the case where the pattern in which the cone angle θ of the active region for the transistor showing the fourth embodiment is restricted to 45 degrees, is disposed in plural form as illustrated by the sixth embodiment. Even in the case of the present embodiment, the area can be reduced as compared with the area of the conventional active region. Further, the speed of electron beam drawing for creating a mask can be increased in a manner similar to the fourth embodiment.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. A pattern form of an active region of a MOS type semiconductor device comprising:
    a semiconductor substrate having a main surface including an active region and a separation region, said separation region substantially surrounding said active region, said active region having first, second and third parts, said first part extending across a center of said active region in a first direction and being interposed between said second and third parts, each of said second and third parts having a first side which is adjacent to said first part and a second side which is distal with respect to said first part, each of said second and third parts having substantially the same shape;
    a gate electrode formed over said first part of said active region; and
    each of said second and third parts having a width defined along said first direction, with the width of each of said second and third parts decreasing in relation to distance from said first side toward said second side.

2. A pattern form of an active region of a MOS type semiconductor device according to claim 1, wherein said active region is shaped in the form of a polygon.

3. A pattern form of an active region of a MOS type semiconductor device according to claim 2, wherein said active region is shaped in the form of an octagon.

4. A pattern form of an active region of a MOS type semiconductor device according to claim 2, wherein said active region is shaped in the form of a hexagon.

5. A pattern form of an active region of a MOS type semiconductor device according to claim 3, wherein the octagon has four interior angles each of which is 135 degrees.

6. A pattern form of an active region of a MOS type semiconductor device according to claim 4, wherein the hexagon has four interior angles each of which is 135 degrees.

7. An array of active regions of a MOS type semiconductor device, comprising:
    wherein a pattern form of each active region comprises:
        (a) a semiconductor substrate having a main surface including an active region and a separation region, said separation region substantially surrounding said active region, said active region having first, second and third parts, said first part extending across a center of said active region in a first direction and being interposed between said second and third parts, each of said second and third parts having a first side which is adjacent to said first part and a second side which is distal with respect to said first part, each of said second and third parts having substantially the same shape;
        (b) a gate electrode formed over said first part of said active region; and
        (c) each of said second and third parts having a width defined along said first direction, with the width of each of said second and third parts decreasing in relation to distance from said first side toward said second side;
    a first active region group having a plurality of said active regions disposed in a second direction, intersecting the first direction, at predetermined intervals;
    a second active region group having a plurality of said active regions adjacent to one side of said first active region group and disposed in the second direction at predetermined intervals;
    a third active region group having a plurality of said active regions adjacent to the other side of said first active region group such that said first active region group is interposed between said second and third active region groups, the active regions of said third active region group being disposed in the second direction at predetermined intervals; and
    said active regions of said first active region group being nonsuperimposed on said active regions of said second and third active region groups with respect to the first direction.

8. A pattern form of an active region of a MOS type semiconductor device according to claim 7, wherein said plurality of active regions are respectively shaped in the form of polygons.

9. A pattern form of an active region of a MOS type semiconductor device according to claim 8, wherein said plurality of active regions are respectively shaped in the form of octagons.

10. A pattern form of an active region of a MOS type semiconductor device according to claim 8, wherein said plurality of active regions are respectively shaped in the form of hexagons.

11. A pattern form of an active region of a MOS type semiconductor device according to claim 9, wherein each of the octagons has four interior angles each of which is 135 degrees.

12. A pattern form of an active region of a MOS type semiconductor device according to claim 10, wherein each of the hexagons has four interior angles each of which is 135 degrees.

13. An array of active regions of a MOS type semiconductor device, comprising:

wherein a pattern form of each active region comprises:
  (a) a semiconductor substrate having a main surface including an active region and a separation region, said separation region substantially surrounding said active region, said active region having first, second and third parts, said first part extending across a center of said active region in a first direction and being interposed between said second and third parts, each of said second and third parts having a first side which is adjacent to said first part and a second side which is distal with respect to said first part, each of said second and third parts having substantially the same shape;
  (b) a gate electrode formed over said first part of said active region;
  (c) each of said second and third parts having a width defined along said first direction with the width of each of said second and third parts decreasing in relation to distance from said first side toward said second side; and
  (d) said active region having a width defined along said first direction, the width of said active region decreasing in relation to distance from said center of such active region; and a plurality of said active regions disposed in the first direction being placed such that a plurality of said gate electrodes corresponding to an nth column as seen in the first direction are respectively displaced from a plurality of said gate electrodes corresponding to an n+1th column as seen in the first direction.

14. A pattern form of an active region of a MOS type semiconductor device according to claim 13, wherein said plurality of active regions are respectively shaped in the form of polygons.

15. A pattern form of an active region of a MOS type semiconductor device according to claim 14, wherein said plurality of active regions are respectively shaped in the form of octagons.

16. A pattern form of an active region of a MOS type semiconductor device according to claim 14, wherein said plurality of active regions are respectively shaped in the form of hexagons.

17. A pattern form of an active region of a MOS type semiconductor device according to claim 15, wherein tapered angles opposite respective sides of said each octagon are respectively 45 degrees.

18. A pattern form of an active region of a MOS type semiconductor device according to claim 16, wherein tapered angles opposite respective sides of said each hexagon are respectively 45 degrees.

* * * * *